United States Patent [19]

Moll

[11] 4,280,192

[45] Jul. 21, 1981

[54] MINIMUM SPACE DIGITAL STORAGE OF ANALOG INFORMATION

[76] Inventor: Edward W. Moll, 32 Woodstream Dr., Norristown, Pa. 19403

[21] Appl. No.: 61

[22] Filed: Jan. 2, 1979

Related U.S. Application Data

[63] Continuation-in-part of Ser. No. 757,687, Jan. 7, 1977, abandoned.

[51] Int. Cl.[3] .......................... G06F 3/00; H03K 13/02

[52] U.S. Cl. .................................. 364/900; 179/1 VC; 179/15.55 T

[58] Field of Search ... 364/200 MS File, 900 MS File; 179/1 SA, 1 SM, 1 SG, 6 E, 6 R, 1 VC, 100.1 VC, 100.1 DR, 15 AC, 15 AP, 15.55 T, 15.55 R; 340/146.1 BA; 358/133, 260, 261; 320/109

[56] References Cited

U.S. PATENT DOCUMENTS

| | | | |
|---|---|---|---|
| 3,104,284 | 9/1963 | French et al. | 179/1 SM X |
| 3,462,555 | 8/1969 | Presti | 179/15 AC |
| 3,851,106 | 11/1974 | Jacobaeus | 179/15 AP |
| 3,976,844 | 8/1976 | Betz | 364/900 X |
| 4,053,712 | 10/1977 | Reindl | 179/15.55 T |

OTHER PUBLICATIONS

Boies, S. J. et al., "Encoding and Decoding of Digital Speech", IBM Tech. Dis. Bull., vol. 19, No. 6, Nov. 1976, pp. 2357–2358.

*Primary Examiner*—Gareth D. Shaw
*Assistant Examiner*—Thomas M. Heckler

[57] ABSTRACT

Analog or digital information, for example an audio input, is converted to a digital representation and encoded prior to storage in a digital form for minimizing the space required for storage of the digital information. Pauses are eliminated and encoded in a form indicating the occurrence of the pauses. Data is compared with prior received data such as to detect repetition. When repetition is detected, a code indication of the period of repetition and the duration of repetition is inserted in the stored data. Information is restored utilizing decoding networks responsive to the inserted codes which cause reinsertion of the pauses and repetitions. Also, when the information is restored, background audio may be provided in the silent periods either from a separate memory or, when available, from an audio input circuit.

16 Claims, 9 Drawing Figures

CONTROL DATA FORMAT

CONTROL DATA FORMAT INSERT LOCATION

REPEAT DETECT

CODE INSERT

CODE DETECT

RECEIVE CONTROL

RECEIVE CONTROL

MINIMUM SPACE DIGITAL STORAGE OF ANALOG INFORMATION

This application is a C-I-P of Ser. No. 757,687 filed Jan. 7, 1977, now abandoned.

BACKGROUND OF THE INVENTION

The present invention has for principal object to minimize the storage space required for storing digital data corresponding to analog or digital information by eliminating pauses or repetitions in the stream of information. The present invention is thus primarily concerned with conserving the storage space to digitally store information such as, for example, audio information. The present invention accomplishes its purpose by not storing information that is unnecessary or that can be easily reproduced such as intervals of time during which no information is supplied, or such as repetitive input information. The present invention therefore has many applications in devices where it is desired to conserve storage space.

Examples of applications in which the present invention is particularly useful are as follows, although it will be appreciated that the present invention is not limited to such applications:

the storage of audio information such as dictation, speech, or conferences, wherein the information is stored digitally and considerable storage space is normally occupied by silent periods, useless information and repetitive information;

playback of recorded announcements or messages, for example in automatic telephone answering or interception devices;

electronic voice annunciating systems and speech synthetizers;

voice-, tone- or other input-actuated devices remotely started and operated for a predetermined time interval;

bank money transfer devices operated, for example, from touch tone telephones or by digital code or voice prints to condense instructions, to acknowledge instructions by audio messages, and to retain a record of bank transaction requests;

recording and playback of messages to telephone subscribers whose line was busy when called;

playback of recorded messages by remote telephone subscriber instructions;

detection of repetitive patterns and storage of information with respect to the detected patterns, length of the pattern, the length of time to repeat the pattern, and start or stop codes;

message synthetizer reproducing messages reconstructed by combining sounds, partial words, words, phrases and sound periods from a store of such sounds, partial words, words and phrases;

detection and storage of repetition in information or data in digital form.

SUMMARY OF THE PRESENT INVENTION

The present invention accomplishes its purpose by providing logic means for encoding digital data representative of analog or digital information to indicate pauses in the stream of information, beginning of pauses and duration of pauses, by coding and omitting the storage of repetitive information, and by providing means for decoding and reinserting such pauses at their appropriate location in the stream of information and for reconstructing the repetitive information and background information.

A better understanding of the present invention will be apparent to those skilled in the art when the following description of the best mode contemplated for practicing the invention is read in conjunction with the attached drawing wherein like reference numerals relate to like elements.

DETAILED DESCRIPTION OF THE PREFERRED EMBODIMENTS

Figure 1:
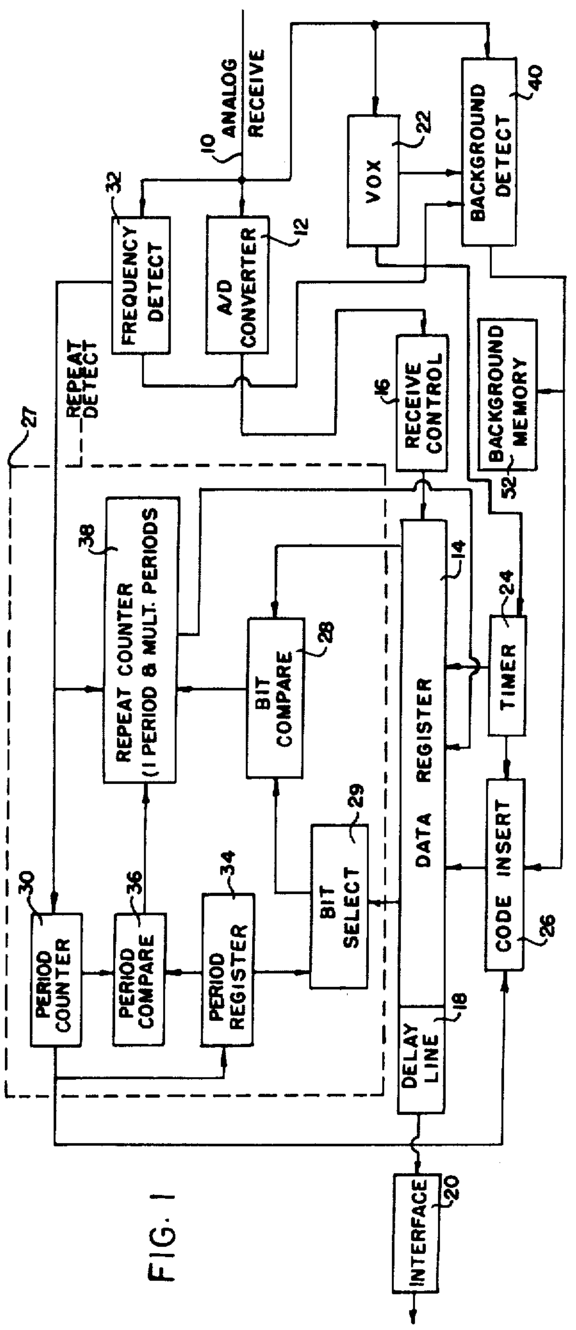
FIG. 1 is a logic function schematic of an interface receive unit according to the present invention.
Figure 8:
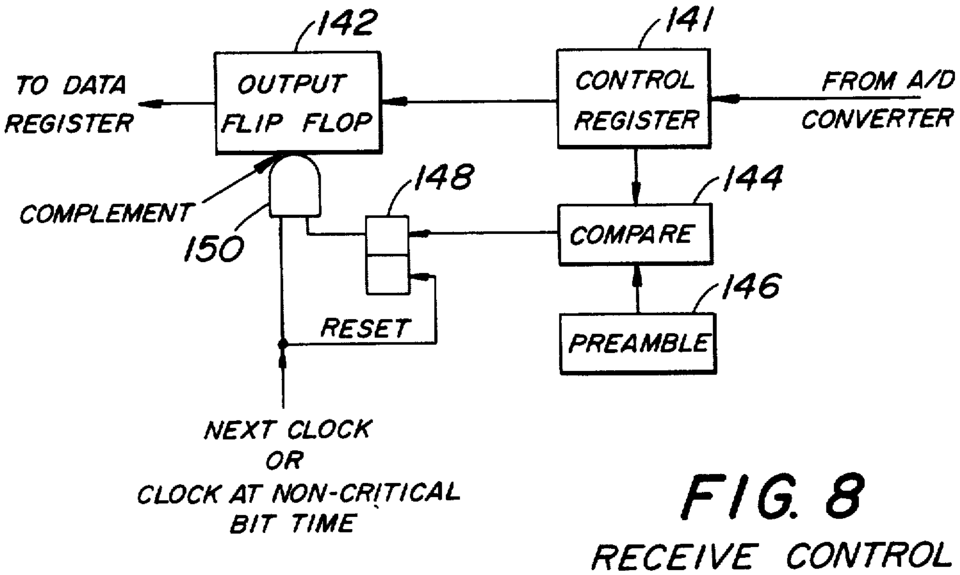
Figure 9:
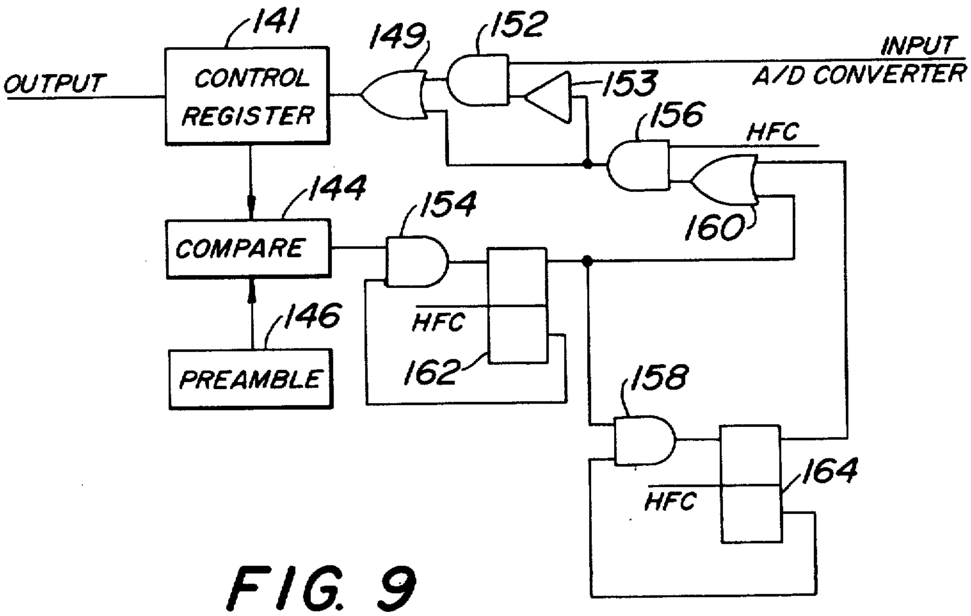

Referring now to the drawing and more particularly to FIG. 1, analog information, such as audio information is provided by a line 10 to the input of an analog/-digital converter 12 in which it is converted to a digital representation of the analog signal. For example, the A/D converter 12 preferably of the continuously variable slope delta (CVSD) modulation type similar to Motorola integrated circuit, XC 3417 or XC 3418, provides at its output a digital 1 for each positive-going potential of the analog signal, and a digital 0 for each negative-going potential. The stream of digital bits at the output of the A/D converter 12 is fed to a data register 14 through a receive control 16 eliminating or modifying all bit configurations which could be mistaken for a preamble. The data register 14 stores the bits of information and is of sufficient capacity so as to provide the features of a delay line 18 prior to sending the information to the interface 20 of a computer or storage device. Two types of the receive control 16 are illustrated in FIGS. 8 and 9 (described later).

Figure 6:
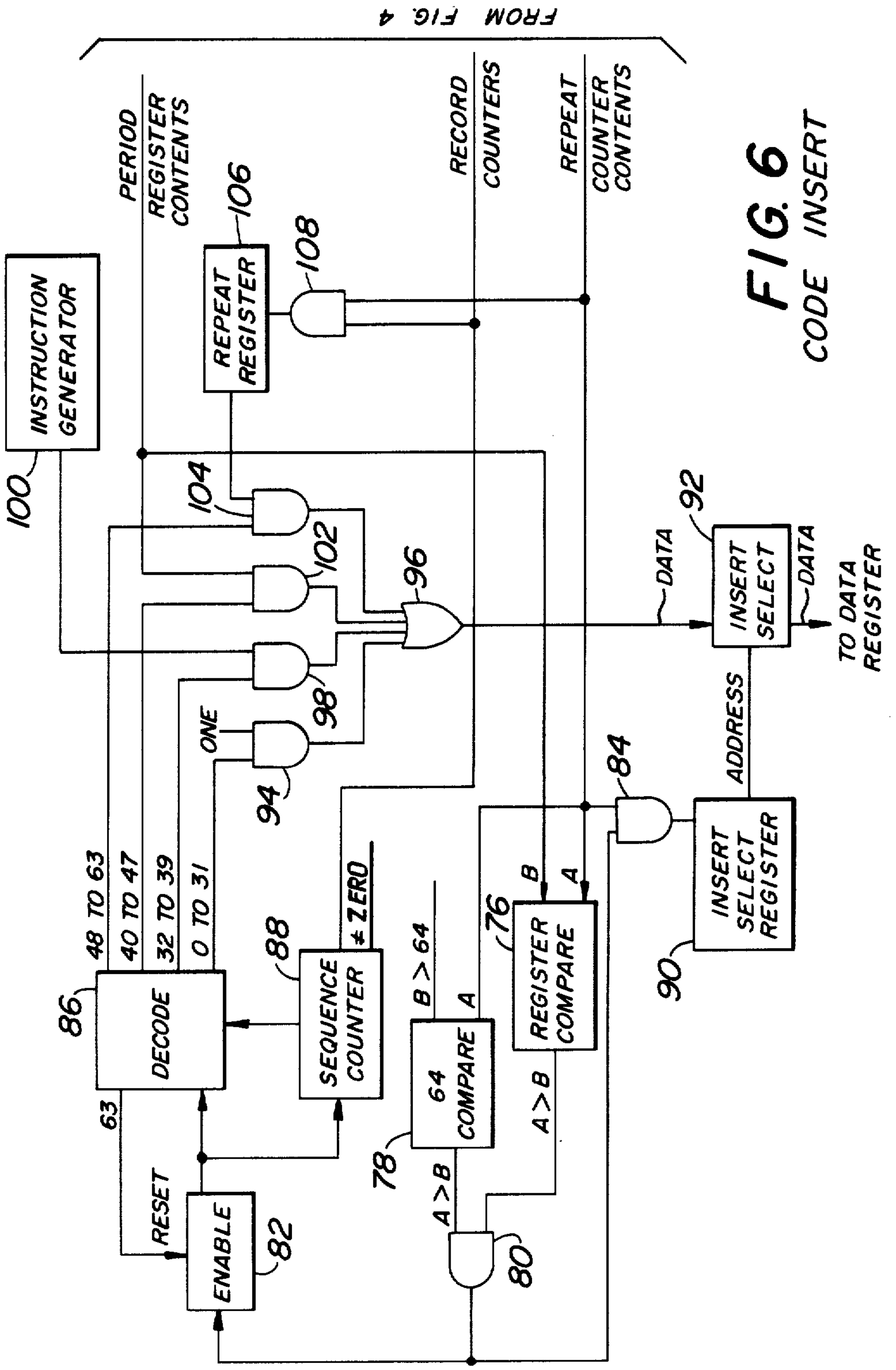
FIG. 6 is a block diagram illustrating details of a code insert arrangement which may be used in connection with the system illustrated in FIGS. 1 and 2.

Although a serial type of data register is involved in the embodiment of the invention described, the data register may also be a circulating or parallel register. The circuitry required to transfer the data from the A/D converter 12 to the data register 14 through the receive control 16 may take various forms apparent to those skilled in the art. An example of selective insertion and utilization of data in conjunction with a register and its control gates is illustrated in FIGS. 6, 8, 9 of U.S. Pat. No. 3,426,330, issued Feb. 4, 1969 to Marx and Moll. These figures in the patent illustrate shifting of data and loading data (or code words) at desired bit positions in a register. Also, in FIG. 9 of U.S. Pat. No.

3,426,330, the selection of output data or flip flops is illustrated. This arrangement may be compared to the bit select 29 when it chooses the appropriate bit of the data register 14 for comparison by the bit compare 28 to control feedback determination and control.

As previously indicated, the A/D converter 12 output passes through receive control 16 to eliminate or modify bit configurations which could be mistaken for a preamble. If a stream of data was such as to duplicate a preamble, the system could make an error. Therefore the A/D converter 12 output is monitored for data which would duplicate a preamble (operation of receive control 16 described later).

Preambles are in common use to get bit streams in synchronization and to separate control words from random data. An example of separating control information from random data is used in the Bell System T Carrier framing techniques where specified bit patterns are inserted and detected for control purposes. This feature is described in the Bell System Tech. Journal, October, 1972, pages 1704–1708.

The analog receive 10 information is also supplied to a VOX, or voice-operated switch, 22 similar to the break-in threshold detector used in the Wescon model 6220 echo suppressor and as referred to in U.S. Pat. No. 3,906,172. The VOX 22 provides an output signal when the analog signal amplitude at its input drops below a predetermined level. A signal at the output of the VOX 22 thus indicates the start of a pause, and it is applied to the input of a timer 24. When the analog signal amplitude at the input of the VOX 22 rises above a predetermined level, the signal at the input of the timer 24 is removed and the timer 24 is stopped.

A code insert 26, operated by the timer 24, applies a preamble and appropriate code(s) to the appropriate position in the data register 14. Details of the code insert 26 will be described in connection with FIG. 6. It is a common practice when inserting codes within a data stream to have a predetermined bit pattern inserted prior to the code in order to differentiate and separate subsequent codes from the data. Many types of preambles are used today depending on the type of data being passed and the required code detect reliability. An example of this is the ASCII Control Code (American Standard Code for Information Interchange) bit pattern which is inserted within ASCII data to recognize the control codes. Another example of separating control information from data is also found in the Bell System T Carrier, as described in the Bell System Tech. Journal, October, 1972, pages 1704–1708.

The actual bit patterns of the preamble and control codes are a design detail and not claimed as being unique. The length of pause code may be binary number representing the number of bit times consumed by the pause of valid data. An example of this is a very commonly used time delay count stored in a computer program. In this, the count number is the time to be delayed divided by the time intervals which are used to decrement the count to zero.

The codes which emanate from the code insert and which are an arbitrary choice of the designer are formed by the connection of the logic gates within the code insert. An example of where the instruction code of a computer designates action to be performed is found in the aforementioned U.S. Pat. No. 3,426,330.

Figure 3:
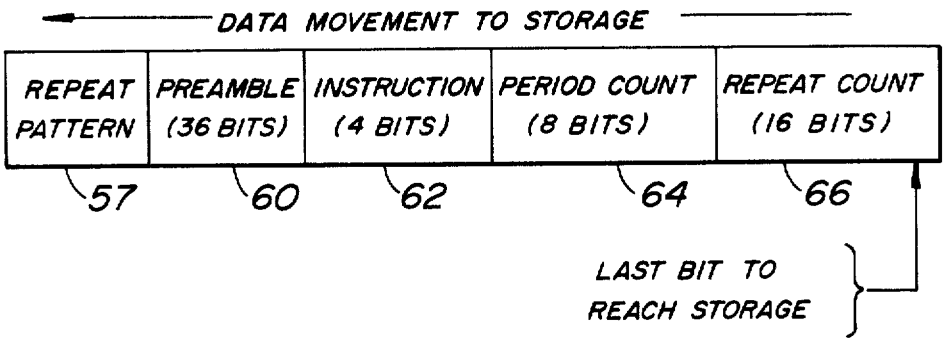
FIG. 3 is a block diagram illustrating a general control data format which may be used in the present invention.

The code insert 26 inserts in the data register 14 formats similar to that shown in FIG. 3 containing a repeat count or length of pause code 66 as determined by the timer 24. The delay line function 18 (FIG. 1) is used to provide a variable length register for facilitating insertion of the codes at the appropriate location in the data stream in order to compensate for the time it takes the VOX 22 to perform its function, thereby eliminating front syllable clipping or wasted silent period storage space at the end of a syllable. Repetition of data is detected by a repeat detect logic circuit 27. As the digital input is received in the data register 14 from the receive control 16, the bit pattern is compared in a bit comparator 28 with data previously received in the data register 14.

The time difference for comparison is determined by a bit select 29 under the control of a period counter 30 which is triggered by a frequency detector or zero crossing detector 32, in the following manner.

The frequency or zero crossing detector 32 receives at its input the analog (possibly voice) signal through the line 10. The frequency or zero crossing detector 32 determines the period of the fundamental frequency of the audio signal. Alternately a peak detector may be used in the stead of a frequency or zero crossing detector. Each trigger, or alternatively series of triggers if so arranged, from the frequency detector 32 causes a comparison to be made in the period compare 36 between the period determined as counted by the period counter 30 counting bit clock pulses and the prior registered count in the period register 34. At the same time the contents of the period counter 30 is transferred to the period register 34 and the period counter 30 is reset.

If an unequal comparison is made, the new period count from the period counter 30 is loaded into the period register 34, and a logic signal at the output of the period comparator 36 resets a repeat counter 38. If an equal comparison is made, the repeat counter 38 is allowed to continue counting the repeated period clock pulses. When a sufficient number of equal comparisons have been made (detailed later) a preamble code is inserted into the data by the code insert 26 immediately after a sample of the pattern 57 to be repeated, followed by an instruction 62 and a period length code 64. No further data is allowed to progress from the data register 14 to the interface 20 until an unequal comparison occurs. At that time, the repeat counter 38 value is inserted into the data register 14 immediately after the period count 64, after which new data is again allowed to flow through the data register 14 from the receive control 16.

Figure 5:
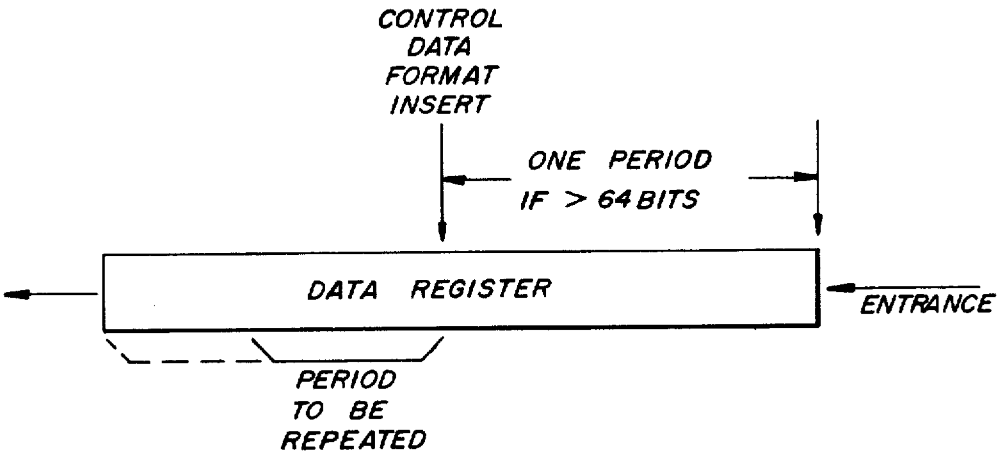
FIG. 5 is a block, illustrating generally the control data format as related to the data register illustrated in FIGS. 1 and 2.

As shown in FIG. 5 for the control data format insert (in order to insure space for 64 bits of preamble and control information without losing data), allowance must be made for valid repetition of at least 64 bits after start of preamble. Also, it must be insured that valid repeated data continues beyond the control data format for a smooth transition from repeated data to non-repeated data. Therefore, the control data format is inserted as described below.

The optimum location for the control data format to be inserted is a location from the entrance of the data register 14 greater than the period count and greater than the number of bits used for the control data format. This is more fully illustrated in connection with the code insert in FIG. 6. The repeat counter 38 continues to count the total bits being repeated and the period register 34 continues to hold the size of the repeated pattern as long as the frequency detect continues at the same pulse rate and the input bit pattern is repetitious. When the repeat counter contents is higher than the period register it is known that at least one full period has been duplicated in the data register. It is now acceptable to send instructions for duplication of data provided the instruction mechanism (control data format) does not replace more data than it can regenerate. In this example the critical number of bits is 64 because that is the size of the control data format illustrated in FIG. 3.

FIG. 3 shows the control data format of the general type which may be inserted into the data stream via the data register 14 of FIG. 1. Pictured to show the data moving out to the left of the data register toward the interface 20, the first portion is the normally stored data which was detected to be repetitive referred to as repeat pattern 57.

A preamble 60 is next sent and may comprise, for example 32 ones, two zeros, and two ones. The preamble format is not claimed as being unique and may be a different bit configuration. The preamble purpose is to alert the data recovery logic to special instructions to be followed in order to reproduce repetitive data, insert background data, etc.

The instruction 62 which follows the preamble may, for example, contain 4 bits. The period count 64 may contain 8 bits which is a binary number specifying the actual number of bits which are contained in the repeat pattern immediately preceding the preamble.

The repeat count 66 may contain 16 bits which is a binary number specifying the actual number in terms of bit times that the repeat pattern is repeated to recover the data bit configurations originally inserted into the data register 14 of FIG. 1.

Except for the period count 64, a similar control data format is used and a similar logic is used in a background detect 40 for obtaining an actual audio background data sample by selecting different VOX levels lower than acceptable speech levels and adding a "background information" code as the instruction so that the transmit logic recognizes that this data should be placed in a background generator memory 52. A background noise detector is explained in Bell Labs Record, September, 1973, pages 236 and 237.

Figure 2:
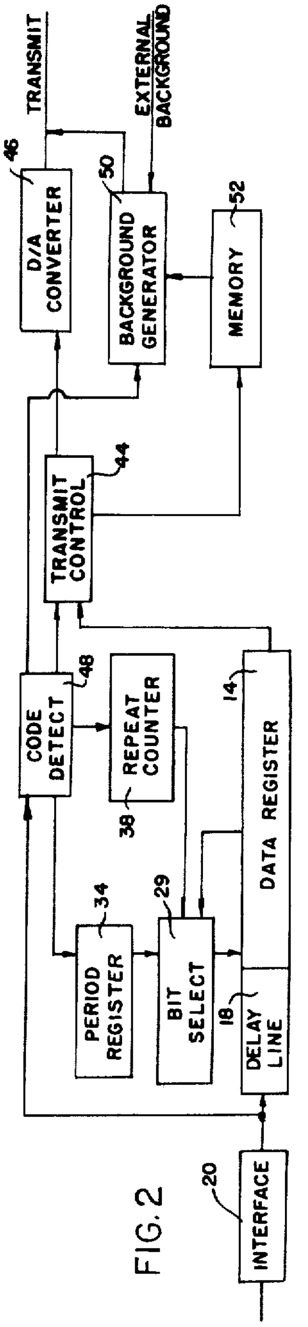
FIG. 2 is a logic function schematic of the transmit portion of the unit according to the present invention.

Preferably, for some application, a sample of "background noise" is obtained from the input line 10, and is coded so that it can be loaded into the background memory 52 (FIG. 2). Such a sample is taken from the audio input line 10, with the VOX 22 setting below the voice threshold and above an absolute silent level and, as required, as compared to information from the peak detector in the frequency detect 32 indicating that there are no significant amplitude variations caused by voice.

The background noise memory is a very desirable, although not an absolutely necessary element because, as is presently the case in telecommunications with satellite circuit echo suppressors or TASI type circuits using VOX circuitry to cut off the audio, the telephone user thinks he had been cut-off, or at least is disturbed by the feeling of talking into nothing when background noise is not there.

FIG. 2 illustrates a logic functional diagram of the analog data reproducing portion of the present invention, some of the elements of which are identical with the elements of FIG. 1 and are provided with the same reference numerals. The stored digital data is sent from storage or a computer through the interface 20 and the delay line 18 to the data register 14. The data is extracted from the data register 14 through a transmit control 44 and is applied to the input of a digital-analog converter 46, such as Motorola XC 3417 or XC 3418, for conversion to an analog form. The digital data is also applied from the interface 20 to the input of a code detector 48. The code detector 48 is continuously looking for codes such as preambles, pause codes, pause length, repeat codes, period length, number of repeat periods and the like. The code detector 48 turns on and off the transmit control 44 which in turn turns on and off the data extract from the data register 14. The code detector 48 also turns on and off a background generator 50 which may receive its input either from the memory 52 or from an external background, when the control data format is coded for background noise.

A preamble precedes all codes (or instructions). When a preamble is sensed, the code detector 48 initiates the proper function the same as a command decode used in digital computers as pointed out in the aforementioned U.S. Pat. No. 3,426,330, in column 9 starting at line 48. A designer skilled in the art is capable of decoding codes with properly wired gates in order to load a count into the repeat counter 38 as shown in FIG. 2, load a count into the period register 34 and to instruct the transmit control when to get data from the data register 14 and whether to pass it to the D/A converter 46 and/or memory 52. Again, reference is made to U.S. Pat. No. 3,426,330 in column 9, starting at line 24.

The transmit control 44 gates data out of the data register. The transmit control 44 can gate the data to either the D/A converter 46 and/or memory 52 under control of its output code detect 48.

The original signal is recreated partly by the data register 14, code detect 48, bit select 29, period logic and the transmit control 44. The transmit control 44 (FIG. 7) contribution to this is as follows.

Gating of the data register output performs the pause function as detected and directed by the code detect 48. The description of VOX 22, timer 24 and code insert 26 as described above shows how the pauses are detected and coded for use by the code detect 48 and transmit control 44. The pause length is duplicated at the transmit side just as it was found by the VOX 22, timer 24, and coded by the code insert 26 at the receive side.

The transmit control 44 gates background noise into memory 52 when directed to by the code detect 48.

The code detector 48 is connected to the interface 20 to detect preamble codes before the data is transmitted to the D/A converter 46, and to extract such codes before the data is passed all the way through the data register 14. Transmission of the data from the data register 14 to the D/A converter 46 is stopped by the transmit control 44 when the code detector 48 detects a pause instruction code, and for a time interval determined by the repeat count 66 code (FIG. 3). The transmit control 44 is turned on again by the code detector 48 at the end of the coded pause length contained in the repeat count 66. When the code detector 48 detects a repeat start code, the period count 64 (FIG. 3) is loaded into the period register 34 to control the bit select 29 to feed back the signal from the appropriate bit position in the data register 14 and the repeat counter 38 is set to the repeat count 66 code which immediately follows the period count 64 code. The repeat counter 38 counts downward as each bit is repeated and when it reaches zero, causes the bit select 29 to discontinue its feedback and allow subsequent data to resume its flow through the data register 14.

The period register 34 again controls the bit select 29 logic to repeat a previously received bit pattern in the data register by reinserting it into an earlier bit position as selected by the period register 34 operating condition. This operating condition was loaded by the code detect 48. Bit select logic is well known in the art. It may be a solid state component made by Texas Instruments, Type SN74154 with its 16 outputs feeding the data register 14, the input enable coming from repeat counter 38, recirculating bit from the data register 14 and four control bits (for each 16 outputs) from the period register 34.

Details of the various blocks illustrated in FIGS. 1 and 2 will now be described in connection with the subsequent figures. It is understood that the arrangements describes are generally known to those skilled in the art. They are given as examples of how some of the blocks of the system illustrated in FIGS. 1 and 2 may be implemented.

Figure 4:
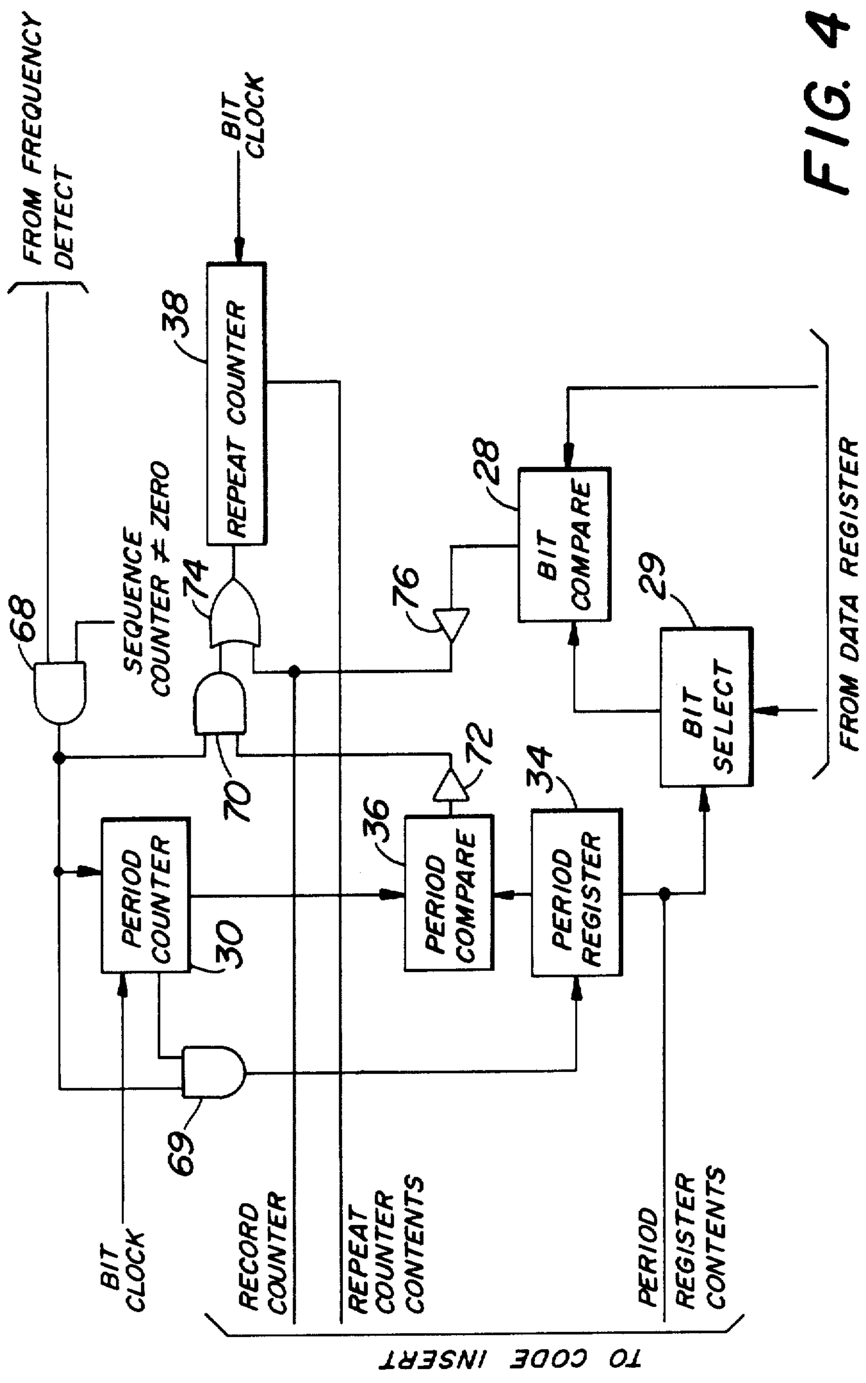
FIG. 4 is a block diagram illustrating the details of a one type of repeat detect arrangement which may be used with the system illustrated in FIGS. 1 and 2.

Referring to FIG. 4, the blocks illustrated are the same as those illustrated in FIG. 1 in connection with the repeat detect 27. Some additional details have been added.

The output signal from the frequency detect 32 (FIG. 1) is applied to the period counter 30 through an AND gate 68. The other input terminal of AND gate 68 is connected from sequence counter 88 (FIG. 6) where an output is developed when the sequence counter 88 does not equal zero.

The output of the AND gate 68 is applied to one input terminal of an AND gate 70. The output signal from the period compare 36 is applied through an inverter 72 to the other input terminal of the AND gate 70.

The output of the AND gate 70 is applied through an OR gate 74 to the repeat counter 38. The OR gate 74 also receives input signals from the bit compare 28 through an inverter 76. The output signal from the inverter 76 is also applied to a line designated "Record Counter" which is connected to the sequence counter 88 illustrated in FIG. 6.

Referring to FIG. 6, details of the code insert 26 of FIG. 1 are illustrated. Generally, as previously implied, the purpose of the code insert 26 is to put the preamble and the entire code format into the data stream at the appropriate position where it immediately follows a sample of the pattern to be repeated. In a typical system to be generally referred to, the entire code format is assumed to be 64 bits. Another reason for the code insert 26 is to make sure that there is 64 bits of repetition or repetitous data before a code format is inserted into the data and that data is not blocked.

In carrying out the operation, a comparator is used to make sure that the repeat count is more than 64 bits. Also a second comparison must be made to assure that a full repeat cycle or full repeat period has been detected. This is done by assuring that the count from period register 30 is smaller than the repeat counter 38, i.e., the repeat counter 38 must be greater than the period register 30.

When at least one character or one repetition is received, a comparator 76, which is always comparing, receives and compares the output signals from repeat counter 38 with those from the period register 30. When repeat counter 38 is greater than the period register 30, there will be at least one character of repetition and it is necessary to assure that there is enough repeated data so as not to wipe out any data with a control word and a comparison with the 64 bit count may be made.

The 64 count and the count from the repeat counter 38 is compared by a comparator 78. The output signals from comparators 76 and 78 are applied to an AND gate 80. When the AND gate 80 generates an output signal, it is applied to an enable flip flip 82 and to sufficient AND gates 84 to handle the output bits from the repeat counter 38.

The output signal from the enable flip flop 82 is applied to a decode circuit 86 and sequence counter 88 which will be described later.

The repeat counter 38 contents (16 bits in this invention explanation) passes through AND gate 84 function and is inserted into a select register 90. This is to store the repeat counter contents so that it can direct the insert select 92 to the position of the data register 14 into which this information is to be inserted. The insert select 92 comprises an address decoder that selects the right bit position in the data register 14. The sequence counter 88 and the enable flip flop 82 enable the decoder 86 as the counter goes from 0 to 31. All the time the sequence counter 88 is from 0 to 31, the AND gate 94 will feed 1's to develop output signals. The output signals from the AND gate 94 are applied through an OR gate 96, through the insert select 92 to the data register 14. This continues for 32 bit counts until the count reaches 31 after which the AND gate 94 closes.

Next the AND gate 98 is opened for counts 32 through 39. This allows the instruction generator 100 to insert its output signals immediately following the first 32 bits.

The instruction generator 100 has mandatory four bits each of which is the part of the preamble and fixed at 0011 when it starts putting an instruction into the AND gate 98. The subsequent four bits (after 0011) are dependent upon the operating conditions of the system of FIG. 1 whether or not there is a repetition sample, background sample, etc. There will be a specific code for these four bits. For instance, 0001 might be selected to indicate a repetitious pattern. After the preamble, the instruction is transmitted from the instruction generator 100 to the AND gate 98 during the 32 through 39 counts enabled by the decode 86.

After these bits are inserted from the instruction generator 100, the decode 86 and sequence counter 88 have reached 39, the gate 98 will be disabled. When the count goes to 40, the next AND gate 102 is enabled to allow the period register contents to pass serially from the AND gate 102, through OR gate 96 and the insert select 92 to be fed into the data register 14. When the decode 86 is at 47, the sequence counter 88 again stops while a repetition condition is detected. If the repetition is still present, repetition is continued to be searched for and the system waits until it gets a false comparison from the bit compare 28 sampling the data register 14. When the false comparison is present, the signal labled "record counters" becomes true. The false comparison is done by bit compare 28 which is examining the data that is going through the data register 14. The comparator compares a bit that enters the data register with the appropriate bit that has preceded it.

The period register 34 indicates the location of the data that it is comparing. It merely shows the width of the period so that the compare keeps examining the bits that come into the data register and continues comparing it with a fixed location in the data register 14. When that compare is false, the repetition has stopped and the duration of the repetition is registered in the repeat register 106 from the repeat counter 38.

The repeat counter 106 contents is inserted into the control word format. This is the last section of the control word format (FIG. 3) and requires the sequence counter 88 to go from 48 to 63 and the repeat register 106 contents goes into the data register 14. The sequence counter 88 continues counting again from 48 through 63 enabling the AND gate 104 to permit data from the repeat register 106 to pass bit by bit through the OR gate 96 and through the insert select 92 to the data register 14. When the decode 86 has reached 63, the entire code word format has been stored and the enable flip flop 82 is reset.

This part of the operation is now completed and data is allowed to continue uninterrupted through the data register.

Figure 7:
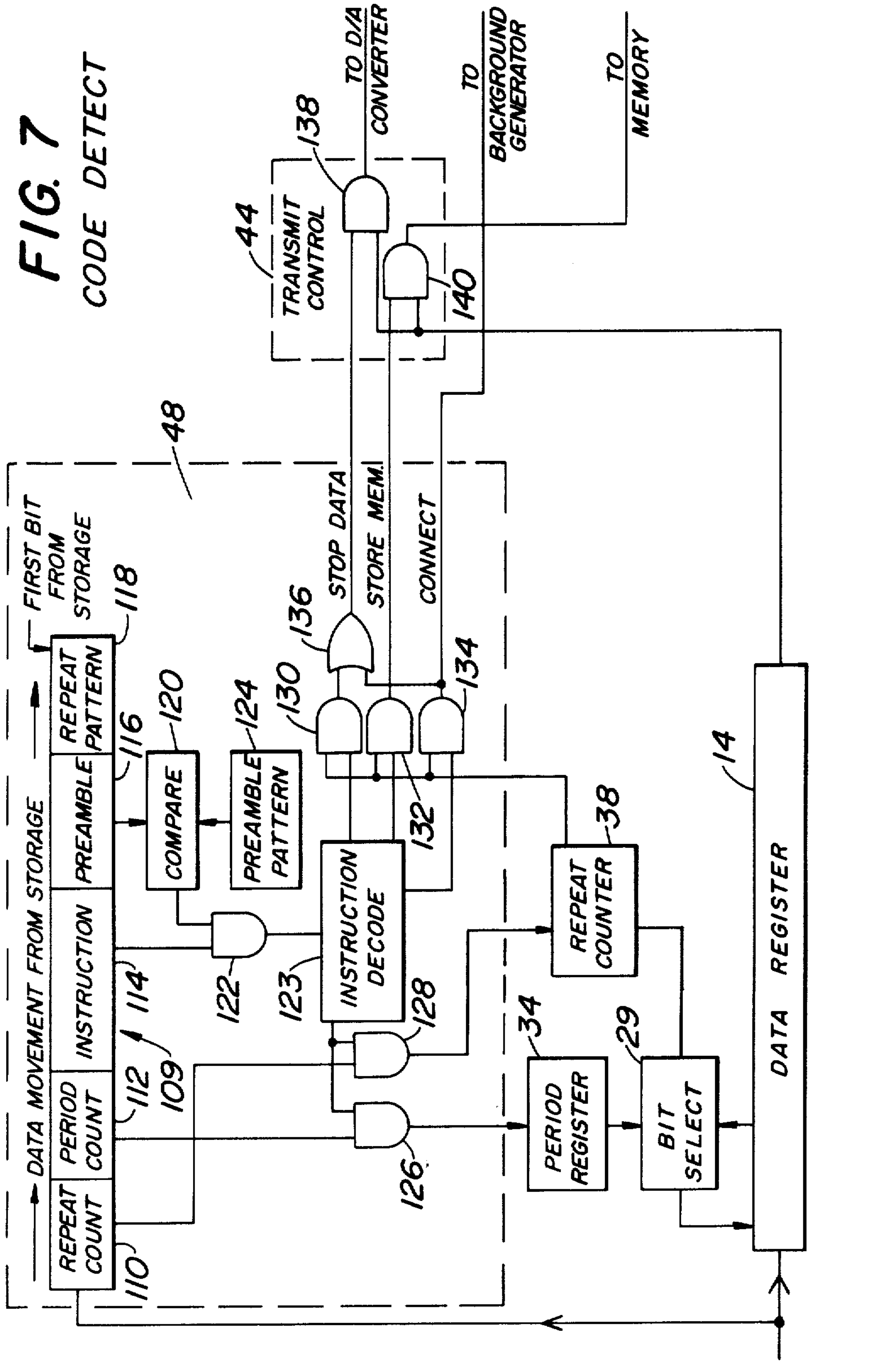
FIG. 7 is a block diagram of a code detect arrangement which may be used with the system illustrated in connection with FIGS. 1 and 2, and FIGS. 8 and 9 are block diagrams of receive control circuits which may be used in the system illustrated in FIGS. 1 and 2.

The code detect 48 and transmit control 44 illustrated in FIG. 2 are shown in FIG. 7. The arrangement includes a number of additional blocks already generally described in connection with FIG. 2. These will not be described further except as they relate to the code detect or transmit control.

Data is applied to the data register 14 and to the code detect 48. A register 109 in the code detector 48 includes locations for various data. For example, the repeat count data is stored in location 110; the period count, in location 112, the instruction, in location 114; the preamble, in location 116, and the repeat pattern, in location 118. The comparator 120 is searching all the time for the preamble. When the comparator 120 sees the preamble at position 116, its knows that just to the right of it, i.e. position 118, is the repeated pattern and to the left, i.e., position 114, is the instruction. The rest of the data in the register 109 relates to a period count in position 112 with the repeat count to its left in position 110.

When the logic related to the comparator 120 compares the preamble from position 116 with the preamble pattern 124, the instruction is decoded and its execution commences. Register 109 is coordinated in time with the data register 14 so that it knows where the information is stored in the data register. Information from the register 109 in position 114 passes through AND gate 122 to an instruction decode circuit 123.

As mentioned, when the comparator 120 compares the preamble, it enables the AND gate 122 to put the contents of the instruction in position 114 into the instruction decode 123. If, for example, the instruction decode 123 sees that it is a repetition, it enables the AND gates 126 and 128 so that the repeat count from position 110 is put into the repeat counter 38 and the period count from position 112 is put into the period register 34. These units cause bit select 29 to regenerate the repetition until the repeat counter 38 has come to zero. When the repeat counter 38 reaches zero, everything has been repeated that needs to be repeated. The bit select 29 will stop that feed back and the data will be allowed to be continued through the data register 14 unchanged.

The repeat counter 38 is applied to AND gates 130, 132 and 134 and also to the bit select 29. The outputs from AND gates 130 and 134 are applied to transmit control 44 through OR gate 136. The output of AND gate 134 is also applied to a background generator.

The AND gate 130 output through OR gate 136 comprises stop data which is applied to AND gate 138. The data register 14 output is also applied to the AND gate 138, with the output of this AND gate being applied to the D/A converter.

The output from AND gate 132 is applied to AND gate 140, which also receives an input from the data register 14, with the output of the AND gate 140 being sent to memory.

Normally for repetitive and non-repetitive data, the transmit control 44 passes data from the data register 14 unchanged and uninhibited. When the code detector 48 detects a preamble followed by an instruction coded to store background information (or noise), it informs transmit control 44 to send the data register 14 output to memory 52 as well as to the D/A converter 46. The number of data bits to be stored in memory 52 is determined by the repeat count 110. The instruction code causes the transmit control 44 to load memory 52 at the same time that data is passed to the D/A converter 46.

When the code detect 48 detects a preamble followed by an instruction 114 coded to insert pre-stored background information (or noise), the transmit control 44 is told by the code detect 48 to stop data to the D/A converter 46. The code detect 48 also instructs the background generator 50 (via AND gate 134 on "connect" lead) to read digital information from the memory 52, convert it to analog and output it via a bridge connection with the D/A coverter 46. The counting down of the repeat counter 38 is used to regulate the duration of time that background generator 50 feeds the transmit output circuit.

When the code detector 48 detects a preamble followed by an instruction 114 coded to insert external background information (or noise), the transmit control 44 is told by the code detector 48 to stop data to the D/A converter. The code detect 48 also instructs the background generator 50 to transfer information from external background onto the transmit output circuit. If the external background information is digital, the background generator 50 will convert it to analog before forwarding it to transmit output circuit.

Referring to FIG. 8, the receive control 16 (FIG. 1) includes a control register 141 which receives and passes data from the A/D converter 12 (FIG. 1), which is 36 bits, or the same bit length as the number of bits chosen for the preamble.

At each bit time of the A/D converter 12, compare 144 makes a comparison with the 36 bit preamble stored in a register 146. When a comparison is made, an output signal is developed and applied to a flip flop circuit 148. At the next bit time, or a non-critical bit time, when a bit has been shifted from the register 141 to an output flip flop 142, the output flip flop 142 is complemented by the output signal from the flip flop 148 which is applied to an AND gate 150. The next clock signal or clock signal at a non-critical bit time is also applied to the AND gate 150 and is used to reset the flip flop 148. When deliberate bit errors cannot be tolerated, the receive control 16 shown in FIG. 8 could be replaced by the receive control 16 illustrated in FIG. 9.

The receive control illustrated in FIG. 9 passes all data through a control register 141 which is 36 bits in length, the same bit length as the number of bits chosen for the preamble. At each bit time a comparison is made with the known 36 bit preamble. If there is no comparison, the data continues through the receive control without alteration.

If a true comparison is found, two additional one bits are inserted into the data stream. These two ones will be decoded by the code detect 48 of the data recovery module as an instruction to remove the extra two ones and treat the preamble pattern the same as any other data it receives. The extra bits are inserted using the high frequency clock (HFC) to insure not losing incoming data. The control register 141, comparator 144 and preamble register 146 may be the same as those illustrated in FIG. 8 and operate in a similar manner.

The input data from the A/D converter 12 (FIG. 1) is applied to an AND gate 152, which produces a signal at OR gate 149, which is applied to control register 141, when other input to the AND gate 152 is true.

The output of the comparator 144 is applied to an AND gate 154, the output of which is applied to a flip flop 162. The output from the flip flop 162 is fed back to the other input of the AND gate 154 to reset flip flop 162 at the immediately following clock pulse.

The output from the flip flop 162 is applied to an AND gate 158, the output of which is fed to another flip flop 164. One output of the other flip flip 164 is fed back to the AND gate 158, with the second output being applied to an OR gate 160. Thus the outputs from the flip flops 162 amd 164 are each applied to the OR gate 160 sequentially to generate the two extra "one" bits. The output signal from the OR gate 160 is applied to AND gate 156 which also receives a signal from a high frequency clock source. The output from the AND gate 156 is applied to OR gate 149 and through inverter 153 to the AND gate 152 to turn off the input data while the two extra ones are inserted into control register 141 via OR gate 149.

While storage space has been emphasized throughout the application, the invention also applies to transmission lines (i.e. telephone, television, data, etc.) where information is transmitted directly to a receiver without using a separate storage means.

What is claimed is:

1. A system for minimizing the storage or transmission requirements of digital representation of analog signals comprising means for converting an analog signal to said digital representation, data register means for storing said digital representation at locations therein dependent upon the time related receipt of said analog signals, first means for detecting the complete absence of said analog signal, second means for detecting the duration of said absence of said analog signal, encoding means for receiving signals from said first and second means for detecting for encoding digital data relating to the absence of said analog signal and for inserting into said data register means in a time related location therein coded information corresponding to a start, time length, and end of the absence of said analog signal at a predetermined time after the end of the absence of said analog signal, and means for transferring said encoded data from said data register means to a storage means.

2. The system of claim 1 further comprising means for delaying the transfer of said encoded data from said data register means.

3. The system of claim 1 wherein said encoding means comprises a timer means for determining the duration of said pauses.

4. The system of claim 1 further comprising means for detecting repetition of said analog signal, means for deriving a repeat code when said repetition is detected and means for inserting in a time related location said repeat code each time a repetition is detected in said data register means to indicate start of a repeat and length of repetition.

5. The system of claim 4 wherein said means for detecting a repeat of said analog signal comprises means for comparing new digital data with data in said data register means and means for preventing transfer of said data from said data register means to said storage means as long as said comparison reveals similarity of a predetermined order.

6. The system of claim 1 further comprising means for reconstructing the analog signal comprising means for transferring said digital data from said storage means to said data register means, digital to analog conversion means, decoding means for determining the start and length of the absence of said analog signal and repetition of said analog signal, means for transferring said digital data from said storage means to said decoding means, analog converting means to reinsert data relating to said absence of said analog signal and repetition of said analog signal, and transmit control means between said data register means and said digital to analog converting means controlled by said decoding means for delaying transfer from said data register means to said digital to said analog converting means.

7. The system of claim 6 further comprising feedback means including a period register and bit selector means for repeating the transmission of said data from said register means to said digital to analog conversion means upon detection by said decoding means of said repetition, and means for ending said feedback upon determination of end of said repetition.

8. The system of claim 1 further comprising means for detecting background noise included in said analog signal, means for storing a sampling of said background noise, encoding means for receiving signals from said means for storing and converting said background noise into background noise digital data coded information, and means for applying the background noise digital coded information relating to said background noise to said data register means at time related locations with respect to said analog signals.

9. The system of claim 6 further comprising means for detecting background noise included in said analog signal, means for storing a sampling of said background noise, encoding means for receiving signals from said means for storing and converting said background noise into background noise digital data coded information, means for applying the background noise digital coded information relating to said background noise to said data register means in time related locations with respect to said analog signal, and means including a memory reinserting said background noise into the reconstructed analog signal.

10. A system for minimizing the storage or transmission requirements of digital representation of analog signals comprising means for converting an analog signal to said digital representation, data register means for storing said digital representation of analog signals in locations in timed relationship with each other, repeat logic circuit means for detecting repetition of an analog signal similar to a previously transmitted analog signal, said means for detecting including means to detect the start and length of said repetition, means for deriving a digital repeat code including data relating to the start and length of said repetition when said repetition is detected, means for inserting said repeat code in said data register means in locations time related to other signals stored therein, and means for transferring said encoded data from said data register means to a storage means.

11. The system of claim 10 further comprising means for delaying the transfer of said encoded data from said data register means.

12. The system of claim 10 wherein said means for detecting a repeat of said analog signal comprises means for comparing subsequently applied digital data with data in said data register means and means for preventing transfer of said data from said data register means to said storage means as long as said comparison reveals similarity of a predetermined order.

13. The system of claim 10 further comprising means for reconstructing the analog signal comprising means for transferring said digital data from said storage means to said data register means, digital to analog conversion means, decoding means for determining repetition and repetition length, means for transferring said digital data from said storage means to said decoding means, and transmit control means between said data register means and said digital to analog converting means, said transfer control means being controlled by said decoding means to delay transfer from said data register means to said digital to analog converting means, and means for reinserting repeated data patterns prior to the digital to analog conversion means.

14. The system of claim 13 further comprising feedback means including a period register and bit selector means for repeating the transmission of said data from said register means to said digital to analog conversion means upon detection by said decoding means of said repeat code, and means for ending said feedback upon determination of end of repeat.

15. The system of claim 10 further comprising means for detecting background noise included in said analog signal, means for storing a sampling of said background noise, and encoding means for receiving signals from said means for storing and converting said background noise into background noise digital data coded information, and means for combining the background noise digital coded information relating to said background noise and said analog signals to produce a reconstructed analog signal.

16. The system of claim 13 further comprising means for detecting background noise included in said analog signal means for storing a sampling of said background noise, encoding means for receiving signals from said means for storing and converting said background noise into background noise digital data coded information, means for applying the background noise digital data coded information relating to said background noise to said data register means at time related locations with respect to said analog signal, and means to combine the signals from said means for storing and said digital to analog conversion means for reinserting said backgrond noise into the reconstructed analog signal.

* * * * *